United States Patent
Chiu et al.

(10) Patent No.: US 11,588,028 B2
(45) Date of Patent: Feb. 21, 2023

(54) SHIELDING STRUCTURE FOR ULTRA-HIGH VOLTAGE SEMICONDUCTOR DEVICES

(71) Applicant: Taiwan Semiconductor Manufacturing Company Limited, Hsinchu (TW)

(72) Inventors: Yi-Cheng Chiu, New Taipei (TW); Tian Sheng Lin, Yangmei Township (TW); Hung-Chou Lin, Douliu (TW); Yi-Min Chen, Hsinchu (TW); Chiu-Hua Chung, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 4 days.

(21) Appl. No.: 17/248,240

(22) Filed: Jan. 15, 2021

(65) Prior Publication Data

US 2022/0231133 A1 Jul. 21, 2022

(51) Int. Cl.
*H01L 21/765* (2006.01)
*H01L 29/40* (2006.01)
(Continued)

(52) U.S. Cl.
CPC .......... *H01L 29/402* (2013.01); *H01L 21/765* (2013.01); *H01L 29/0653* (2013.01); *H01L 29/66681* (2013.01); *H01L 29/7816* (2013.01)

(58) Field of Classification Search
CPC ... H01L 21/761; H01L 21/765; H01L 23/528; H01L 23/552; H01L 29/40; H01L 29/402;
(Continued)

(56) References Cited

U.S. PATENT DOCUMENTS 11,145,713 B2    10/2021   Murukesan et al.
2011/0068377 A1   3/2011   Hsing et al.
(Continued)

FOREIGN PATENT DOCUMENTS

CN     106653849 A     5/2017
KR    20190037084 A    4/2019
(Continued)

OTHER PUBLICATIONS

Taiwan Office Action issued in Application No. 11021053300; dated Oct. 28, 2021, 3 Pages.
(Continued)

*Primary Examiner* — Fazli Erdem
(74) *Attorney, Agent, or Firm* — Harrity & Harrity, LLP

(57) ABSTRACT

A method for manufacturing a device may include providing an ultra-high voltage (UHV) component that includes a source region and a drain region, and forming an oxide layer on a top surface of the UHV component. The method may include connecting a low voltage terminal to the source region of the UHV component, and connecting a high voltage terminal to the drain region of the UHV component. The method may include forming a shielding structure on a surface of the oxide layer provided above the drain region of the UHV component, forming a high voltage interconnection that connects to the shielding structure and to the high voltage terminal, and forming a metal routing that connects the shielding structure and the low voltage terminal.

20 Claims, 14 Drawing Sheets

(51) Int. Cl.
  *H01L 29/78*    (2006.01)
  *H01L 29/66*    (2006.01)
  *H01L 29/06*    (2006.01)

(58) Field of Classification Search
  CPC ......... H01L 29/66; H01L 29/78; H01L 29/06; H01L 29/0653; H01L 29/66681; H01L 29/7816
  USPC ........................................................ 257/339
  See application file for complete search history.

(56)            References Cited

U.S. PATENT DOCUMENTS

| | | | |
|---|---|---|---|
| 2012/0091529 A1* | 4/2012 | Cheng | ............... H01L 29/66166 257/E21.004 |
| 2014/0235028 A1* | 8/2014 | Su | ....................... H01L 29/8605 438/382 |
| 2019/0109189 A1 | 4/2019 | Chiu et al. | |
| 2019/0131296 A1* | 5/2019 | Murukesan | ......... H01L 29/0696 |
| 2019/0165167 A1 | 5/2019 | Lin et al. | |

FOREIGN PATENT DOCUMENTS

| | | | |
|---|---|---|---|
| TW | 201740564 A | 11/2017 | |
| WO | 2014022092 A1 | 2/2014 | |

OTHER PUBLICATIONS

German Office Action issued in German Application No. 10 2021 101 022.5; dated Sep. 6, 2021, 8 Pages.
Taiwan Office Action issued in Application No. 110108841; dated Dec. 3, 2021, 8 Pages.

* cited by examiner

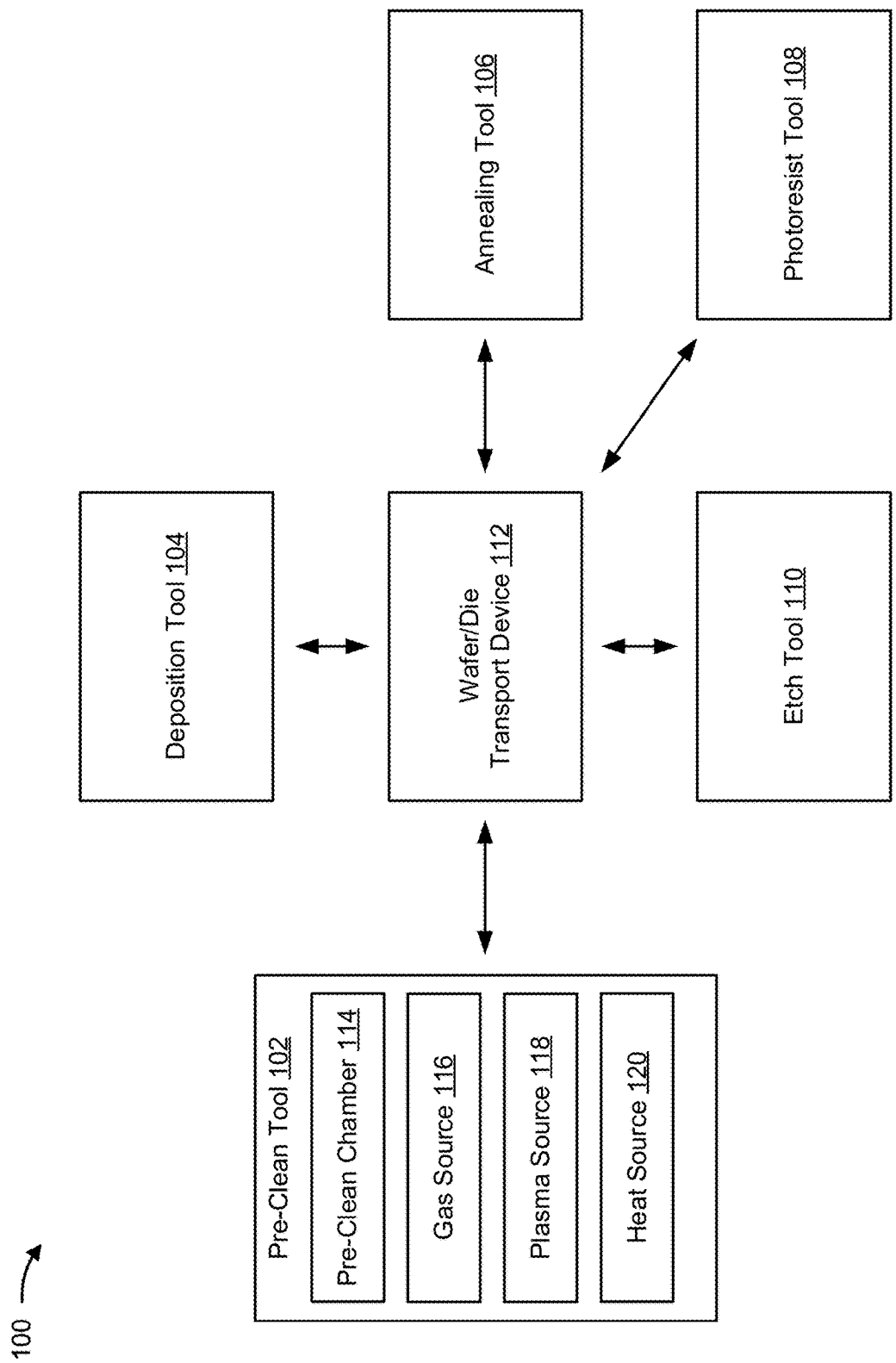

SHIELDING STRUCTURE FOR ULTRA-HIGH VOLTAGE SEMICONDUCTOR DEVICES

BACKGROUND

Technological advances in semiconductor materials and designs have produced generations of semiconductor devices where each generation has smaller and more complex components than the previous generation. However, these advances have increased the complexity of processing and manufacturing semiconductor devices. Thus, a quantity of interconnected components per semiconductor device area has increased, while a geometry size of a smallest component that can be created using a fabrication process has decreased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a diagram of an example environment in which systems and/or methods described herein may be implemented.

DETAILED DESCRIPTION

Figure 2A:
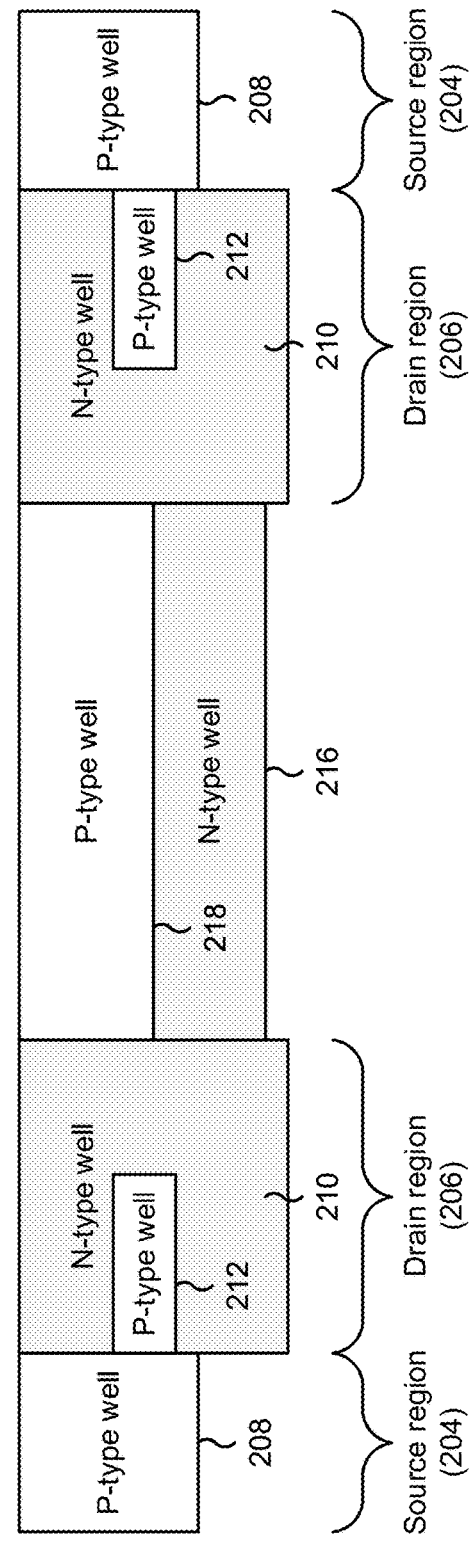
FIGS. 2A-2J are diagrams of one or more example operations involved in manufacturing an example semiconductor device described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various types of passive components (e.g., resistor components) may be fabricated on a semiconductor wafer. Some applications require the resistor components to withstand high voltages, such as a few hundred volts. However, traditional high voltage resistors may suffer from device breakdown issues before a sufficiently-high voltage is attained. For example, traditional high voltage resistors may rely on using a p-type/n-type (P/N) junction to sustain a breakdown voltage. Junction breakdown is limited by doping concentration, which has not been optimized in traditional high voltage resistors.

Field plates and P/N junctions may reduce an intensity of an electric field near a resistor component. A traditional high-voltage junction termination (HVJT) component includes a reduced surface field (RESURF) junction structure and a high voltage interconnection (HVI) that may handle from approximately 0 Volts (V) to approximately 1,000 V. The HVI delivers a signal between an outside HVJT area (e.g., a low-side area that handles from approximately 0 V to approximately 100 V) and an inside HVJT area (e.g., a high side area that handles from approximately 0 V to approximately 1,000 V). High side area devices (e.g., a MOS, a diode, and/or the like) can be put inside the high side area termination (e.g., the inside HVJT area) for high side circuit application. The traditional HVJT component experiences a breakdown voltage (BV) degradation issue during a BV test (e.g., 80V BV drop from a first BV to a second BV and a stable BV from the second BV to a third BV). To address this issue and improve HVJT component reliability, a voltage rule (e.g., an S-rule) of the HVJT component is increased in order to increase a BV of the HVJT component. However, increasing the voltage rule requires increasing the area of the HVJT component to approximately 773.4 microns (e.g., a length) by 573.4 microns (e.g., a height), which is counterproductive to the trend for smaller devices.

According to some implementations described herein, a method may include providing a shielding structure for ultra-high voltage (UHV) semiconductor devices that include HVJT components. For example, the method may include providing a UHV component that includes a source region and a drain region, and forming an oxide layer on a top surface of the UHV component. The method may include connecting a low voltage terminal to the source region of the UHV component, and connecting a high voltage terminal to the drain region of the UHV component. The method may include forming a shielding structure on a surface of the oxide layer provided above the drain region of the UHV component, and forming a high voltage interconnection that connects to the shielding structure and to the high voltage terminal. The method may include forming a metal routing that connects the shielding structure and the low voltage terminal.

In this way, a shielding structure may be provided for UHV semiconductor devices that include HVJT components. The shielding structure may be formed by connecting an implant polysilicon (poly) line to an HVJT component that makes a BV of the HVJT component more robust and significantly reduces the area of the HVJT component (e.g., by approximately 13%) compared to the area of the traditional HVJT component. The shielding structure effectively and successfully shields the HVJT component from a high-voltage electric field generated by a high voltage interconnection (HVI). The shielding structure may be applied to UHV semiconductor devices, laterally-diffused metal-oxide semiconductor (LDMOS) devices, and/or the like.

FIG. 1 is a diagram of an example environment 100 in which systems and/or methods described herein may be implemented. As shown in FIG. 1, environment 100 may include a pre-clean tool 102, a deposition tool 104, an annealing tool 106, a photoresist tool 108, an etch tool 110, and a wafer/die transport device 112. The tools and/or devices included in example environment 100 may be included in a semiconductor clean room, a semiconductor foundry, a semiconductor processing and/or manufacturing facility, and/or the like.

Pre-clean tool 102 includes a pre-clean chamber 114 and one or more devices capable of performing a pre-clean process on a semiconductor device to remove a byproduct layer from the semiconductor device. The one or more devices may include a gas source 116, a plasma source 118, a heat source 120, and/or the like. Gas source 116 may supply various gasses to pre-clean chamber 114, such as an ammonia gas, a nitrogen trifluoride gas, and/or the like. Plasma source 118 may generate a plasma that causes a reaction between the gasses supplied to pre-clean chamber 114. For example, plasma source 118 may include an inductively coupled plasma (ICP) source, transformer coupled plasma (TCP) source, or another type of plasma source capable of causing a reaction between an ammonia gas and a nitrogen trifluoride gas to cause the formation of an ammonium fluoride gas. Heat source 120 may be capable of heating a semiconductor device in pre-clean chamber 114 to cause one or more layers on the semiconductor device to decompose, as described herein. For example, heat source 120 may include a heat lamp, a heating coil, or another type of heating device that heats the semiconductor device to cause an ammonium fluoride layer on the semiconductor device to decompose into an ammonia gas and a hydrogen fluoride gas, as described herein.

Deposition tool 104 is a semiconductor processing tool that includes a semiconductor processing chamber and one or more devices capable of depositing various types of materials onto a semiconductor device. For example, deposition tool 104 may include a chemical vapor deposition device (e.g., an electrostatic spray device, an epitaxy device, and/or another type of chemical vapor deposition device), a physical vapor deposition device (e.g., a sputtering device and/or another type of physical vapor deposition device), an ion implantation device, and/or the like. In some implementations, deposition tool 104 may deposit a metal layer onto a source region or a drain region of a semiconductor device, may deposit a contact material to form a contact of a semiconductor device, and/or the like as described herein.

Annealing tool 106 is a semiconductor processing tool that includes a semiconductor processing chamber and one or more devices capable of heating a semiconductor device. For example, annealing tool 106 may include a rapid thermal annealing (RTA) tool or another type of annealing tool that is capable of heating a semiconductor device to cause a reaction between two or more materials or gasses, to cause a material to decompose, and/or the like. For example, annealing tool 106 may heat a semiconductor device to cause a metal layer on an epitaxial region (e.g., a source region or a drain region) to react and form a metal silicide layer, as described herein.

Photoresist tool 108 is a semiconductor processing tool that removes materials from or provides materials to a semiconductor device based on a photoresist layer (e.g., a photoresist mask) applied to the semiconductor device. A photoresist is a light-sensitive material used in several processes (e.g., photolithography, photoengraving, and/or the like) to form a patterned coating on a surface of a semiconductor device. Photoresist tool 108 may coat the semiconductor device with a photo-sensitive organic material, and may apply a patterned mask to the semiconductor device to block light, so that only unmasked regions of the photo-sensitive organic material will be exposed to light. Photoresist tool 108 or another tool (e.g., etch tool 110) may apply a solvent, called a developer, to the semiconductor device. In the case of a positive photoresist, the photo-sensitive organic material is degraded by light and the developer dissolves away regions that are exposed to light, leaving behind a coating where the mask is placed. In the case of a negative photoresist, the photo-sensitive organic material is strengthened (e.g., either polymerized or cross-linked) by light, and the developer dissolves away only regions that are not exposed to light, leaving behind a coating in areas where the mask is not placed.

Etch tool 110 is a semiconductor processing tool that removes materials from a surface of a semiconductor device. In some implementations, a portion of the semiconductor device is protected from an etchant by a masking material that resists etching. For example, the masking material may include a photoresist that is patterned using photolithography. Etch tool 110 may perform a wet etching process or a dry (e.g., plasma) etching process on the semiconductor device. In the wet etching process, the semiconductor device may be immersed in a batch of a liquid-phase (e.g., wet) etchant, which may be agitated to achieve process control. For example, a buffered hydrofluoric acid (BHF) may be used to etch silicon dioxide over a silicon substrate. The plasma etching process may operate in several modes based on adjusting parameters of the plasma. For example, the plasma etching process may operate at a pressure in a range from approximately 0.01 Torr to approximately 5 Torr. The plasma produces energetic free radicals, that are neutrally charged and that react at a surface of the semiconductor device. Plasma etching may be isotropic (e.g., exhibiting a lateral undercut rate on a patterned surface approximately the same as a downward etch rate) or anisotropic (e.g., exhibiting a smaller lateral undercut rate than the downward etch rate). A source gas for the plasma may include small molecules rich in chlorine or fluorine. For example, carbon tetra fluorine may be utilized to etch silicon and chlorine may be utilized to etch aluminum, trifluoro methane may be used to etch silicon dioxide and silicon nitride, and/or the like. The plasma may also include oxygen that is used to oxidize photoresist and facilitate removal of the photoresist.

Wafer/die transport device 112 includes a mobile robot, a robot arm, a tram or rail car, and/or another type of device that are used to transport wafers and/or dies between semiconductor processing tools 102-110 and/or to and from other locations, such as a wafer rack, a storage room, and/or the like. In some implementations, wafer/die transport device 112 may be a programmed device to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

FIGS. 2A-2J are diagrams of one or more example operations 200 involved in manufacturing an example semiconductor device described herein (e.g., a UHV semiconductor device, an LDMOS device, and/or the like). As shown in FIG. 2A, and by reference number 202, the semiconductor device may provide a UHV component (e.g., an HVJT component) that includes a source region 204 with a first type of well and a drain region 206 with a second type of well. As further shown, source region 204 may include the first type of well (e.g., a P-type well 208).

P-type well 208 may include a material (e.g., silicon, germanium, silicon carbide, silicon germanium, and/or the like) that is doped with a dopant material (e.g., boron, aluminum, gallium, indium, and/or the like). Doping is the intentional introduction of impurities into an intrinsic semiconductor material for the purpose of modulating electrical, optical, and/or structural properties of the semiconductor material. In some implementations, deposition tool 104 of environment 100, described above in connection with FIG. 1, may be utilized to perform a deposition operation that forms the semiconductor material for P-type well 208. Deposition tool 104 (e.g., an ion implantation tool) may also be utilized to implant the dopant material in the semiconductor material and form P-type well 208.

As further shown in FIG. 2A, drain region 206 may include the second type of well (e.g., an N-type well 210), a first type of well (e.g., a P-type well 212) formed in N-type well 210. N-type well 210 may include a material (e.g., silicon, germanium, silicon carbide, silicon germanium, and/or the like) that is doped with a dopant material (e.g., antimony, arsenic, phosphorus, bismuth, lithium, and/or the like). In some implementations, deposition tool 104 of environment 100, described above in connection with FIG. 1, may be utilized to perform a deposition operation that forms the semiconductor material for N-type well 210. Deposition tool 104 (e.g., an ion implantation tool) may also be utilized to implant the dopant material in the semiconductor material and form N-type well 210.

P-type well 212 may include a material (e.g., silicon, germanium, silicon carbide, silicon germanium, and/or the like) that is doped with a dopant material (e.g., boron, aluminum, gallium, indium, and/or the like). In some implementations, deposition tool 104 of environment 100, may be utilized to implant the dopant material in the semiconductor material and form P-type well 212 within N-type well 210.

As further shown in FIG. 2A, the semiconductor device may include central region with the second type of well (e.g., an N-type well 216), the first type of well (e.g., a P-type well 218) formed on N-type well 216. N-type well 216 may include a material (e.g., silicon, germanium, silicon carbide, silicon germanium, and/or the like) that is doped with a dopant material (e.g., antimony, arsenic, phosphorus, bismuth, lithium, and/or the like). In some implementations, deposition tool 104 of environment 100, described above in connection with FIG. 1, may be utilized to perform a deposition operation that forms the semiconductor material for N-type well 216. Deposition tool 104 (e.g., an ion implantation tool) may also be utilized to implant the dopant material in the semiconductor material and form N-type well 216.

P-type well 218 may include a material (e.g., silicon, germanium, silicon carbide, silicon germanium, and/or the like) that is doped with a dopant material (e.g., boron, aluminum, gallium, indium, and/or the like). In some implementations, deposition tool 104 of environment 100, described above in connection with FIG. 1, may be utilized to perform a deposition operation that forms P-type well 218 on N-type well 216. Deposition tool 104 (e.g., an ion implantation tool) may also be utilized to implant the dopant material in the semiconductor material and form P-type well 218.

Figure 2B:
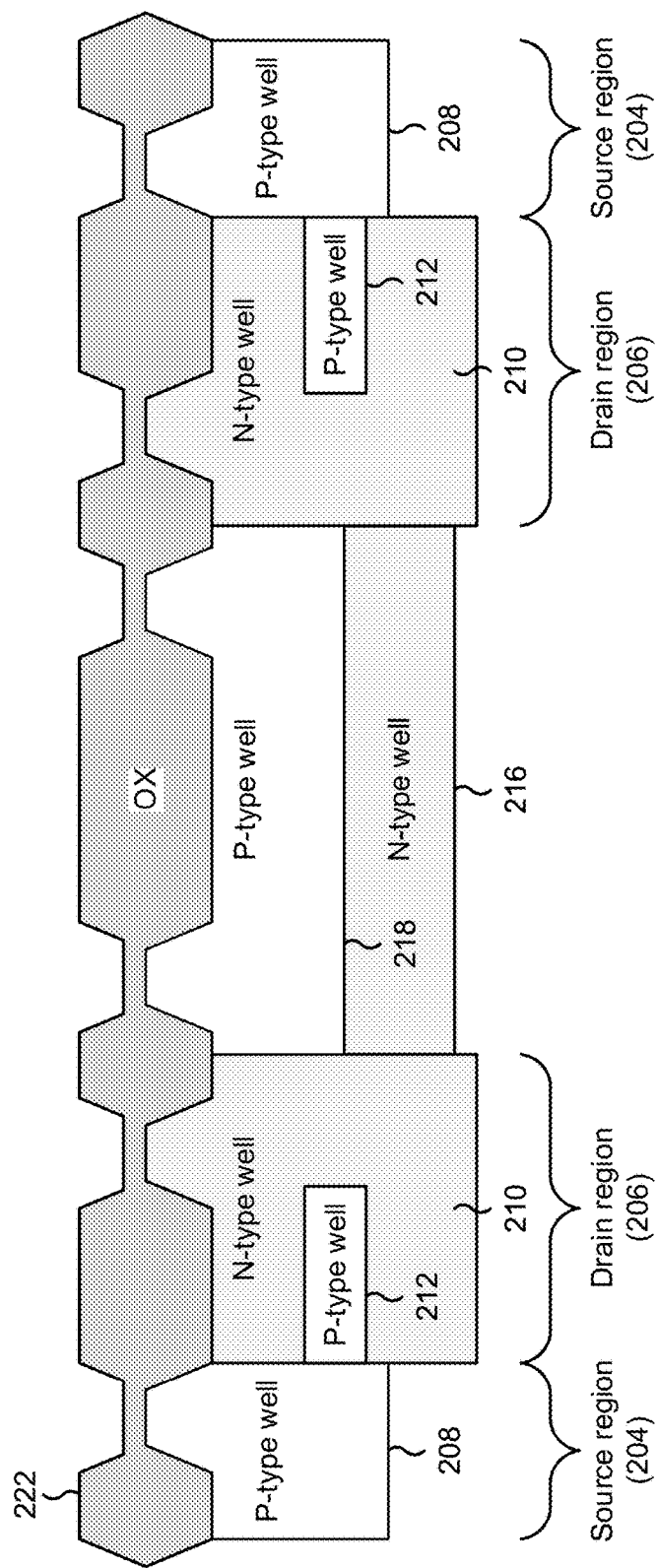

As shown in FIG. 2B, and by reference number 220, an oxide layer 222 may be formed on a top surface of the UHV component. For example, oxide layer 222 may be formed on top surfaces of P-type well 208, N-type well 210, and P-type well 218. Oxide layer 222 may include a dielectric material, such as silicon oxide, silicon dioxide, fluorinated silica glass, silicon, silicon nitride, and/or the like. In some implementations, deposition tool 104 of environment 100, described above in connection with FIG. 1, may be utilized to form oxide layer 222 on the top surfaces of P-type well 208, N-type well 210, and P-type well 218. In some implementations, etch tool 110 of environment 100, described above in connection with FIG. 1, may be utilized to form the shape of oxide layer 222 on the top surfaces of P-type well 208, N-type well 210, and P-type well 218. For example, etch tool 110 may etch portions of P-type well 208, N-type well 210, and P-type well 218 prior to deposition of the material of oxide layer 222.

Figure 2C:
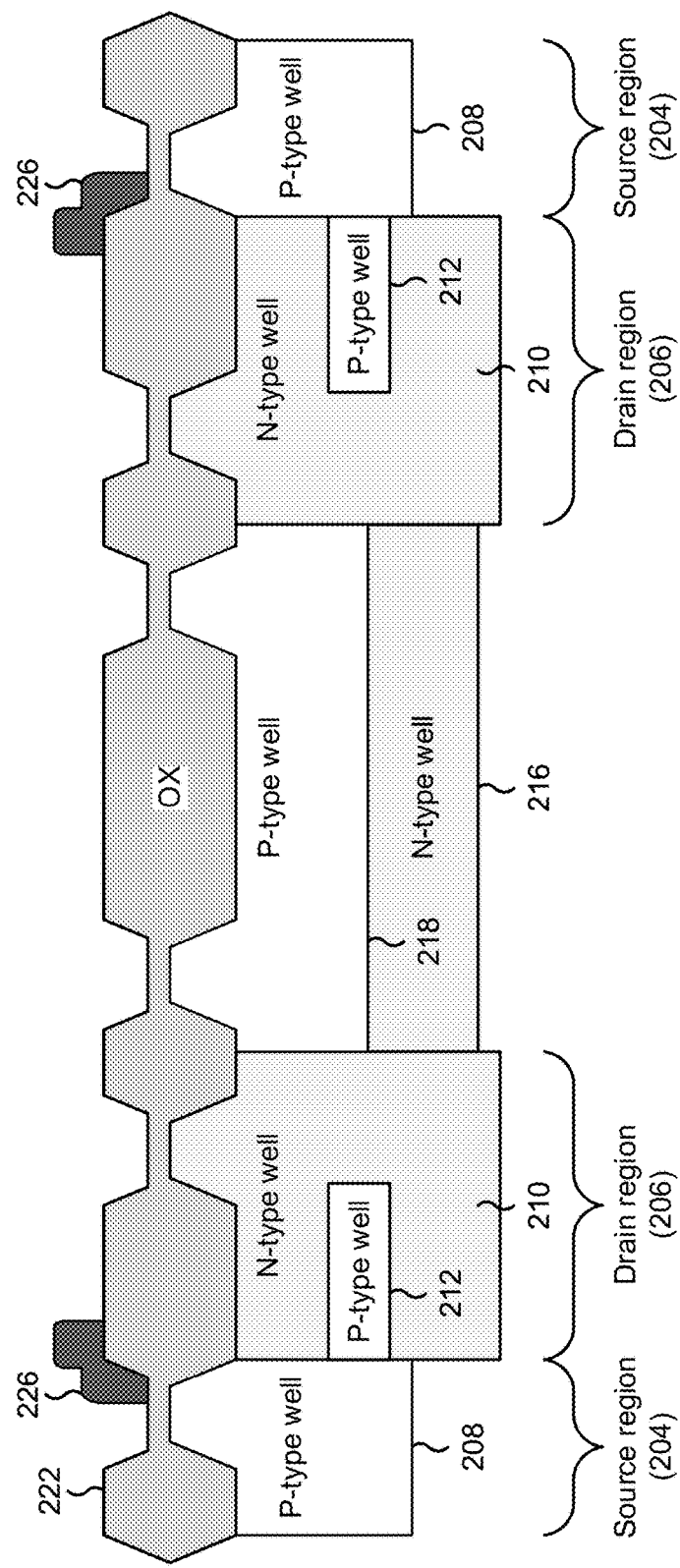

As shown in FIG. 2C, and by reference number 224, a gate poly structure 226 may be formed on oxide layer 222. The gate poly structure 226 may be provided above source region 204 and drain region 206, and may function as a gate structure. Gate poly structure 226 may be formed of a polysilicon. In some implementations, deposition tool 104 of environment 100, described above in connection with FIG. 1, may be utilized to form gate poly structure 226 on oxide layer 222.

Figure 2D:
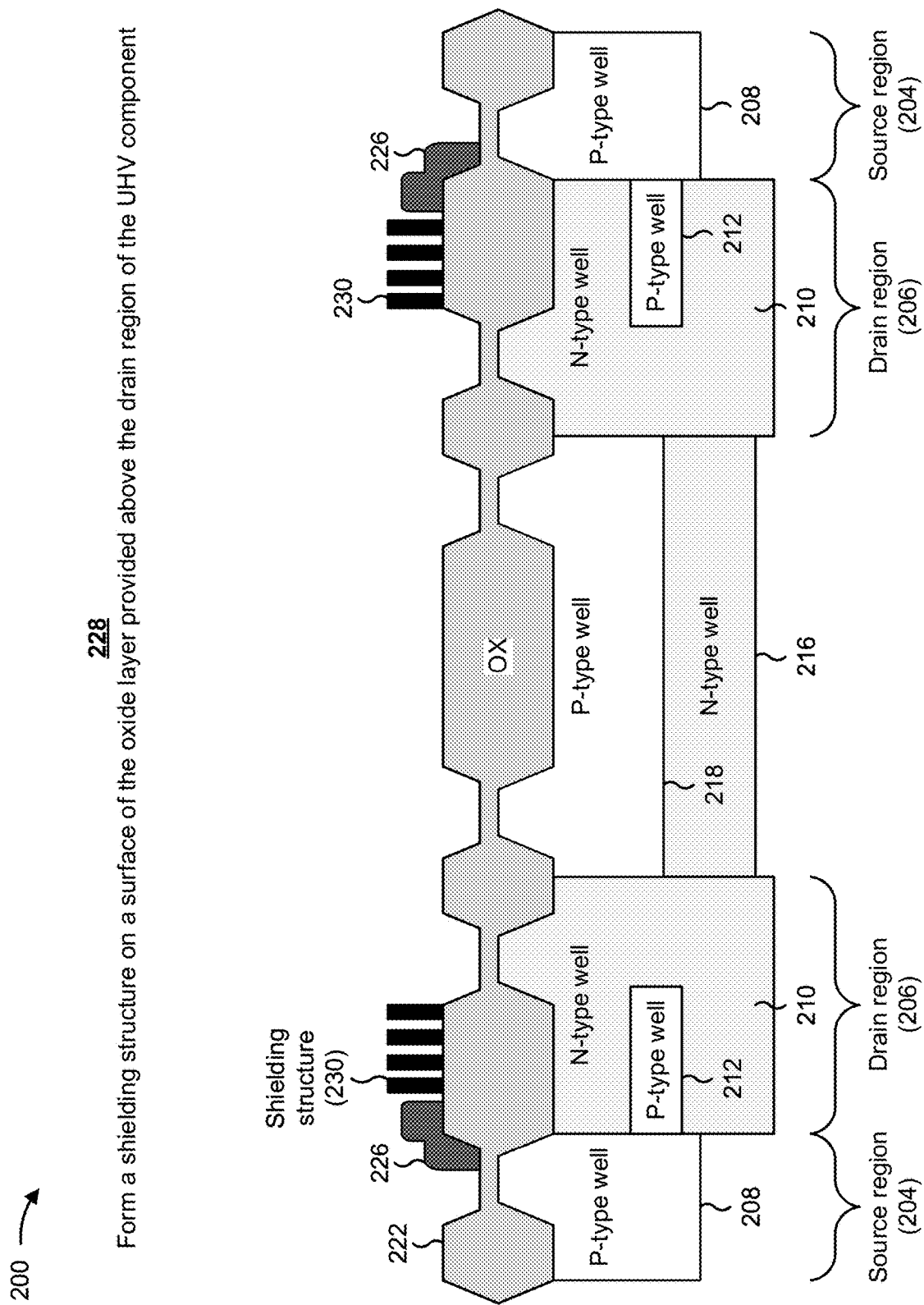

As shown in FIG. 2D, and by reference number 228, a shielding structure 230 may be formed on a surface of oxide layer 222 provided above drain region 206 of the UHV component. In some implementations, shielding structure 230 includes a winding-type implant polysilicon material. In some implementations, deposition tool 104 of environment 100, described above in connection with FIG. 1, may be utilized to form shielding structure 230 on the surface of oxide layer 222 provided above drain region 206 of the UHV component. Further details of shielding structure 230 are provided below in connection with FIGS. 2H-2J.

Figure 2E:
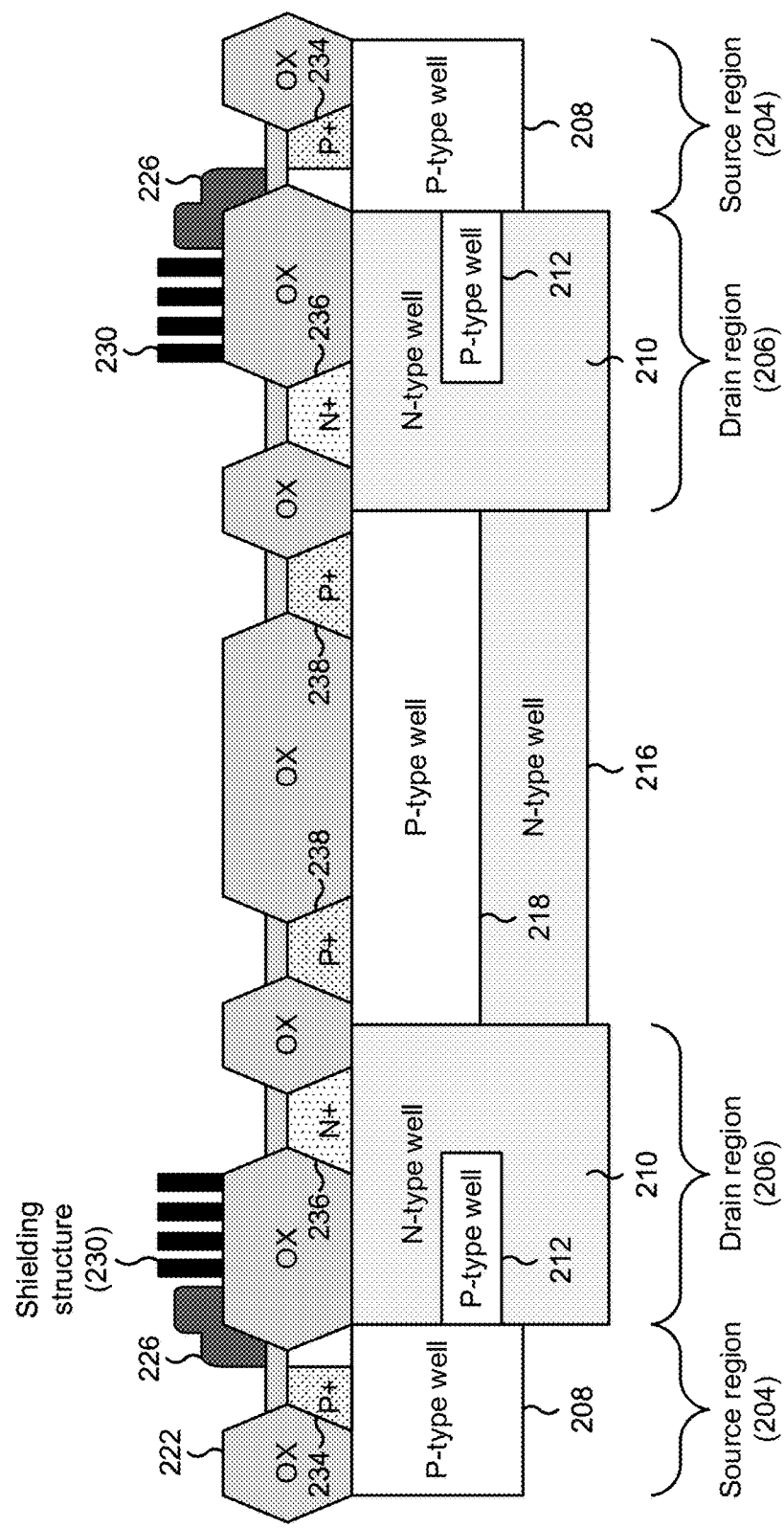

As shown in FIG. 2E, and by reference number 232, a plurality of portions of the oxide layer 222 may be doped to form a source contact 234 formed on P-type well 208, a drain contact 236 formed on N-type well 210, and a central contact 238 formed on P-type well 218. Source contact 234, drain contact 236, and central contact 238 may be formed below a surface of oxide layer 222 such that oxide layer 222 electrically insulates source contact 234, drain contact 236, and central contact 238 from other components of the semiconductor device.

Source contact 234 may include a conductive metal, such as titanium, cobalt, tungsten, aluminum, copper, ruthenium, iridium, and/or the like. In some implementations, source contact 234 may be formed on a top surface of P-type well 208. In some implementations, deposition tool 104 of environment 100, described above in connection with FIG. 1, may be utilized to perform a deposition operation that forms source contact 234 on the top surface of P-type well 208. In some implementations, etch tool 110 of environment 100, described above in connection with FIG. 1, may be utilized to form the shape of source contact 234 on the top surface of P-type well 208. Source contact 234 or a portion of source contact 234 may be doped with a dopant material (e.g., boron, aluminum, gallium, indium, and/or the like), to form a P-type source contact 234. Deposition tool 104 (e.g., an ion implantation tool) may also be utilized to implant the dopant material in source contact 234 and form the P-type source contact 234.

Drain contact 236 may include a conductive metal, such as titanium, cobalt, tungsten, aluminum, copper, ruthenium, iridium, and/or the like. In some implementations, drain contact 236 may be formed on a top surface of N-type well 210. In some implementations, deposition tool 104 of environment 100, described above in connection with FIG. 1, may be utilized to perform a deposition operation that forms drain contact 236 on the top surface of N-type well 210. In some implementations, etch tool 110 of environment 100, described above in connection with FIG. 1, may be utilized to form the shape of drain contact 236 on the top surface of N-type well 210. Drain contact 236 may be doped with a dopant material (e.g., antimony, arsenic, phosphorus, bismuth, lithium, and/or the like), to form an N-type drain contact 236. Deposition tool 104 (e.g., an ion implantation tool) may be utilized to implant the dopant material in drain contact 236 and form the N-type drain contact 236.

Central contact 238 may include a conductive metal, such as titanium, cobalt, tungsten, aluminum, copper, ruthenium, iridium, and/or the like. In some implementations, one or more central contacts 238 may be formed on a top surface of P-type well 218. In some implementations, deposition tool 104 of environment 100, described above in connection with FIG. 1, may be utilized to perform a deposition operation that forms central contact 238 on the top surface of P-type well 218. In some implementations, etch tool 110 of environment 100, described above in connection with FIG. 1, may be utilized to form the shape of central contact 238 on the top surface of P-type well 218. Central contact 238 may be doped with a dopant material (e.g., boron, aluminum, gallium, indium, and/or the like), to form a P-type central contact 238. Deposition tool 104 (e.g., an ion implantation tool) may be utilized to implant the dopant material in central contact 238 and form the P-type central contact 238.

Figure 2F:
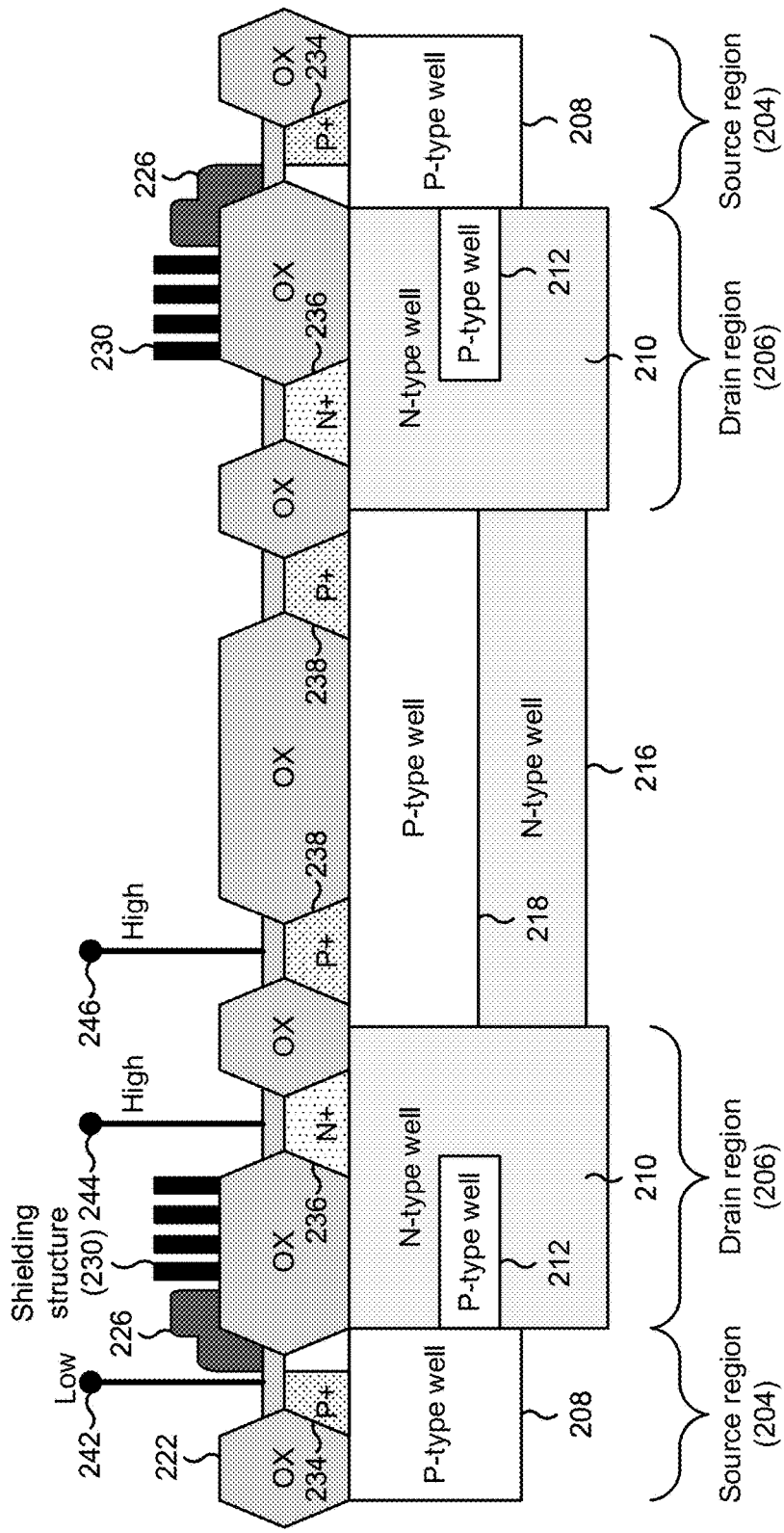

As shown in FIG. 2F, and by reference number 240, a low voltage terminal 242 may be connected to source region 204 of the UHV component and two high voltage terminals 244 and 246 may be connected to drain region 206 and a central region, respectively, of the UHV component.

Low voltage terminal 242 may include a conductive metal, such as titanium, cobalt, tungsten, aluminum, copper, ruthenium, iridium, and/or the like. In some implementations, low voltage terminal 242 may be formed to connect with source contact 234. Low voltage terminal 242 may provide a low-side area (e.g., of the UHV component) that handles from approximately 0 V to approximately 20 V. In some implementations, deposition tool 104 of environment 100, described above in connection with FIG. 1, may be utilized to perform a deposition operation that forms low voltage terminal 242 to connect with source contact 234.

High voltage terminals 244 and 246 may include a conductive metal, such as titanium, cobalt, tungsten, aluminum, copper, ruthenium, iridium, and/or the like. In some implementations, high voltage terminals 244 and 246 may be formed to connect with drain contact 236 and central contact 238, respectively. A first high voltage terminal 244 may provide a high-side area (e.g., of the UHV component) that handles from approximately 20 V to approximately 1,000 V. A second high voltage terminal 246 may provide a high-side area (e.g., of the UHV component) that handles from approximately 0 V to approximately 980 V. In some implementations, deposition tool 104 of environment 100, described above in connection with FIG. 1, may be utilized to perform a deposition operation that forms high voltage terminals 244 and 246 to connect with drain contact 236 and central contact 238, respectively.

Figure 2G:
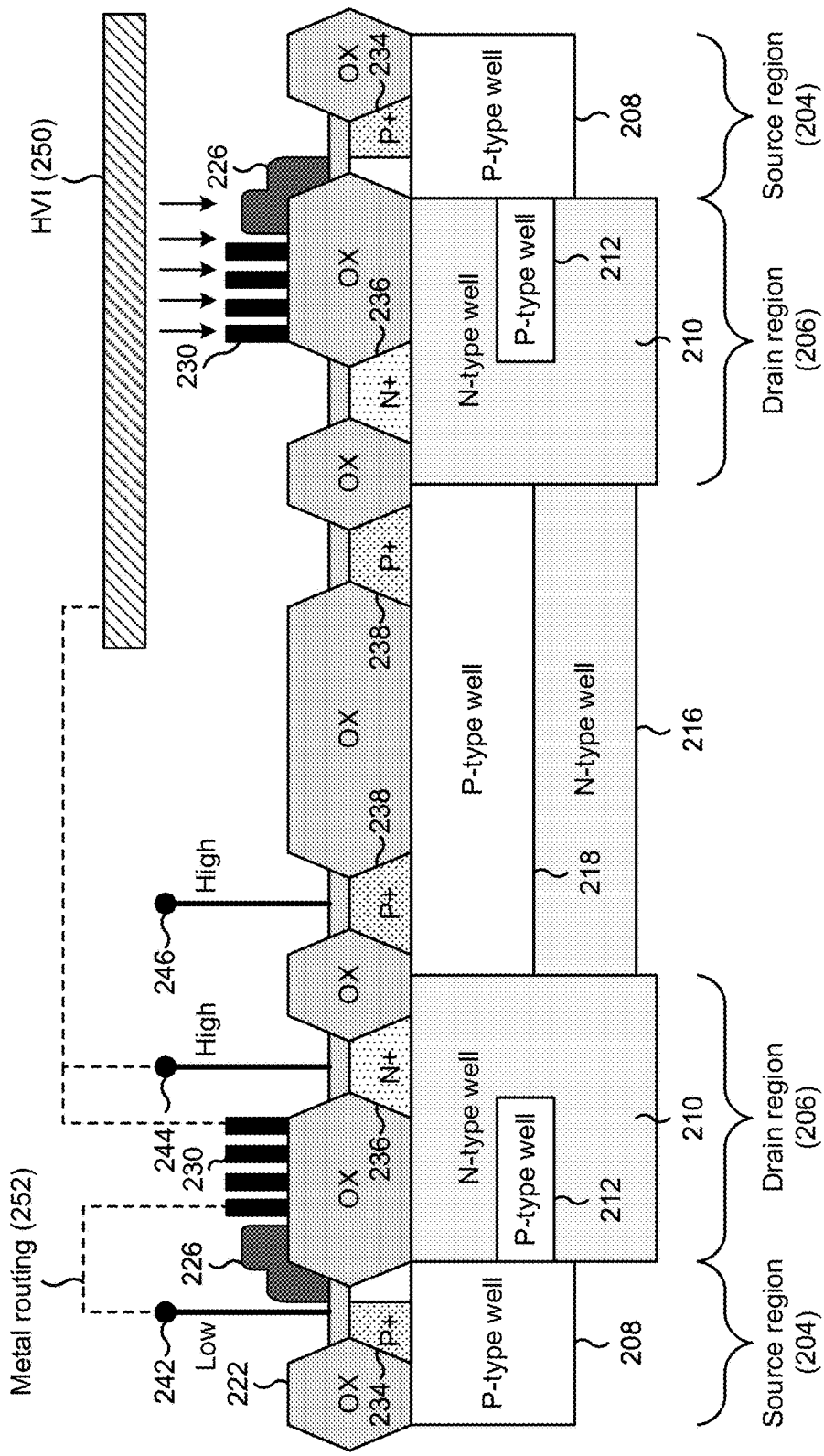

As shown in FIG. 2G, and by reference number 248, a high voltage interconnection (HVI) 250 may be formed and connected to shielding structure 230 and to one of high voltage terminals 244 and 246. As further shown by reference number 248, a metal routing 252 may be formed and connected to shielding structure 230 and low voltage terminal 242. A metal routing 252 may be included for internal connection for device terminals.

HVI 250 may include a conductive metal, such as titanium, cobalt, tungsten, aluminum, copper, ruthenium, iridium, and/or the like. In some implementations, HVI 250 may handle from approximately 0 V to approximately 1,000 V. HVI 250 may deliver a signal between an outside area of the UHV component (e.g., low voltage terminal 242 that handles from approximately 0 V to approximately 20 V) and an inside area of the UHV component (e.g., high voltage terminal 244 that handles from approximately 20 V to approximately 1,000 V or high voltage terminal 246 that handles from approximately 0 V to approximately 980 V). In some implementations, deposition tool 104 of environment 100, described above in connection with FIG. 1, may be utilized to perform a deposition operation that forms HVI 250 to connect with shielding structure 230 and with one of high voltage terminals 244 and 246. In some implementations, shielding structure 230 is configured to shield a high voltage electric field, generated by HVI 250, to maintain a breakdown voltage stability of the UHV component.

Metal routing 252 may include a conductive metal, such as titanium, cobalt, tungsten, aluminum, copper, ruthenium, iridium, and/or the like. In some implementations, metal routing 252 may handle from approximately 0 V to approximately 20 V, which may come from an outside area of the UHV component (e.g., low voltage terminal 242 that handles from approximately 0 V to approximately 20 V). In some implementations, deposition tool 104 of environment 100, described above in connection with FIG. 1, may be utilized to perform a deposition operation that forms metal routing 252 to connect with shielding structure 230 and with low voltage terminal 242.

Figure 2H:
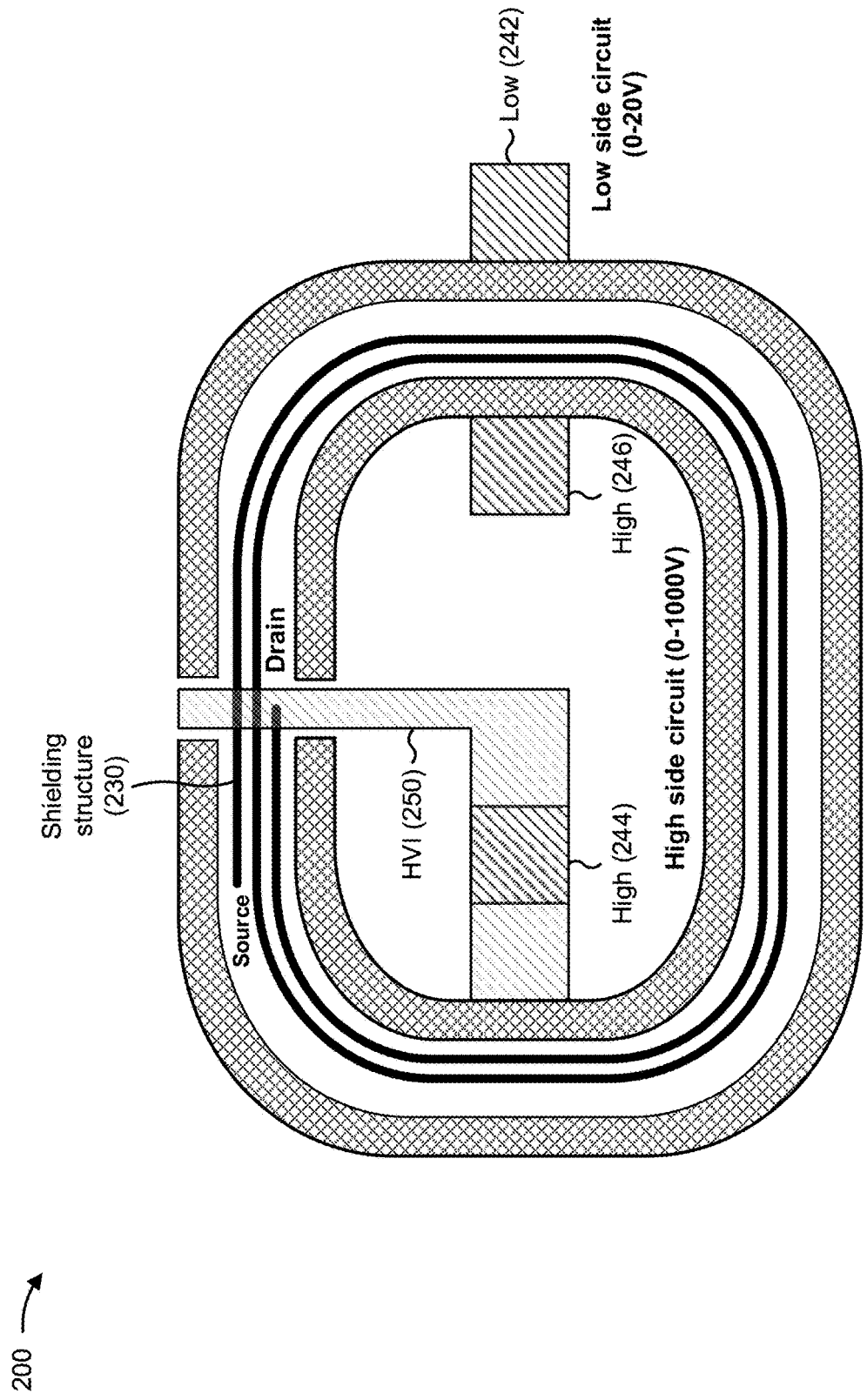

FIG. 2H provides a top plan view of the semiconductor device (e.g., the UHV component) shown in FIGS. 2A-2G. As shown, the semiconductor device may include a low side circuit (e.g., provided by low voltage terminal 242) that handles from approximately 0 V to approximately 20 V. The semiconductor device may also include a high side circuit (e.g., provided by high voltage terminals 244 and 246) that handles from approximately 0 V to approximately 1,000 V. As further shown in FIG. 2H, HVI 250 may connect to high voltage terminal 244, but may also, or alternatively, connect to high voltage terminal 246. Shielding structure 230 depicted in FIG. 2H may include a single winding polysilicon line with one end that connects to source region 204 and another end that connects to drain region 206. In some implementations, shielding structure 230 may be designed in such a way as to permit an area of the UHV component to be reduced by approximately 13% relative to a UHV component without shielding structure 230.

Figure 2I:
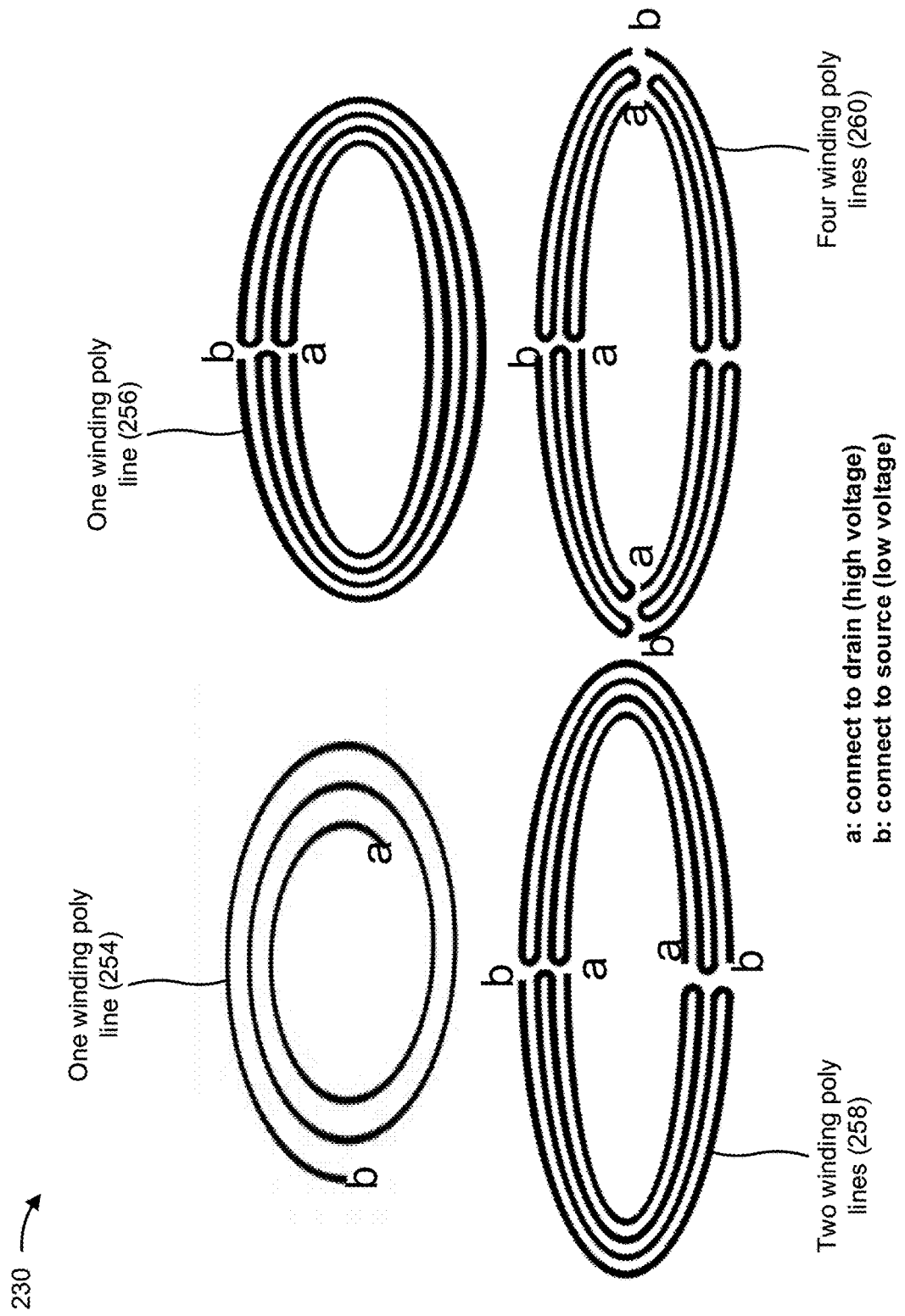

FIG. 2I provides a top plan view of different implementations of shielding structure 230. As shown, shielding structure 230 may include a single winding polysilicon line 254 (e.g., with no U-turns in the line), a single winding polysilicon line 256 (e.g., with U-turns in the line), two winding polysilicon lines 258, four winding polysilicon lines 260, and/or the like. As further shown in FIG. 2I, one end (e.g., end "a") of winding polysilicon line 254 or winding polysilicon line 256 may connect to drain region 206 (e.g., high voltage terminal 244 or 246) and another end (e.g., end "b") of winding polysilicon line 254 or winding polysilicon line 256 may connect to source region 204 (e.g., low voltage terminal 242). Two ends (e.g., ends "a") of two winding polysilicon lines 258 may connect to drain region 206 (e.g., high voltage terminal 244 or 246) and two other ends (e.g., ends "b") of two winding polysilicon lines 258 may connect to source region 204 (e.g., low voltage terminal 242). Four ends (e.g., ends "a") of four winding polysilicon lines 260 may connect to drain region 206 (e.g., high voltage terminal 244 or 246) and four other ends (e.g., ends "b") of four winding polysilicon lines 260 may connect to source region 204 (e.g., low voltage terminal 242).

Figure 2J:
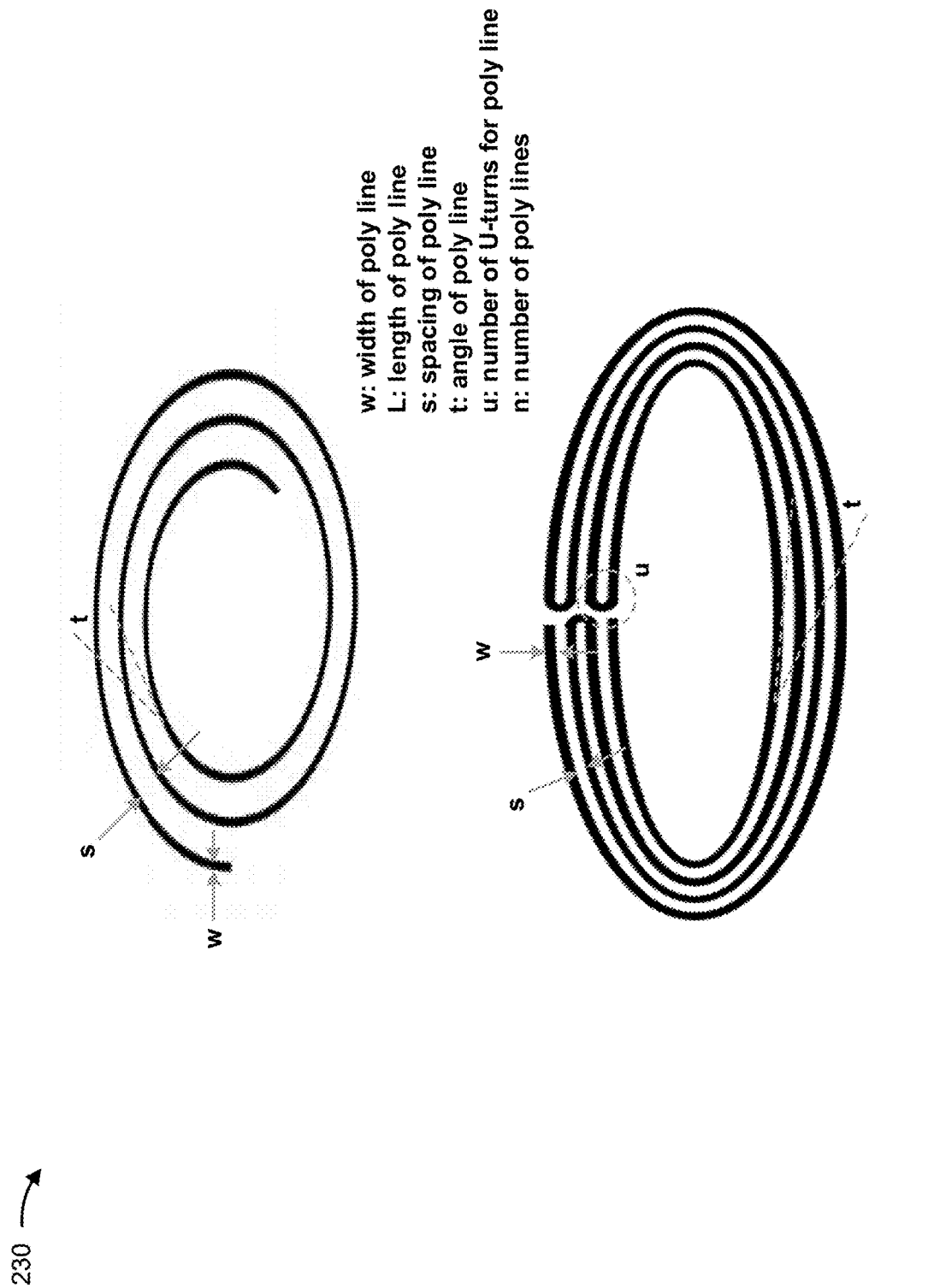

FIG. 2J provides a top plan view of different implementations of shielding structure 230. As shown, shielding structure 230 may include a single winding polysilicon line (e.g., with no U-turns in the line, as shown at the top of FIG. 2J), a single winding polysilicon line (e.g., with U-turns in the line, as shown at the bottom of FIG. 2J), and/or the like. In some implementations, the winding polysilicon line includes various dimensions and/or features. For example, the winding polysilicon line may include a width (w) in a range from approximately 0.05 microns to approximately 7.5 microns. The winding polysilicon line may include a length (L) that is greater than or equal to approximately 0.05 microns. The winding polysilicon line may include at least one spacing (s) in a range from approximately 0.03 microns to approximately 4.5 microns. The winding polysilicon line may include at least one angle of curvature (t) in a range from approximately one degree to approximately thirty degrees. The winding polysilicon line may include a quantity (u) of zero or more U-turns. Shielding structure 230 may include a quantity (n) of one or more winding polysilicon lines.

As indicated above, FIGS. 2A-2J are provided merely as one or more examples. Other examples may differ from what is described with regard to FIGS. 2A-2J.

Figure 3:
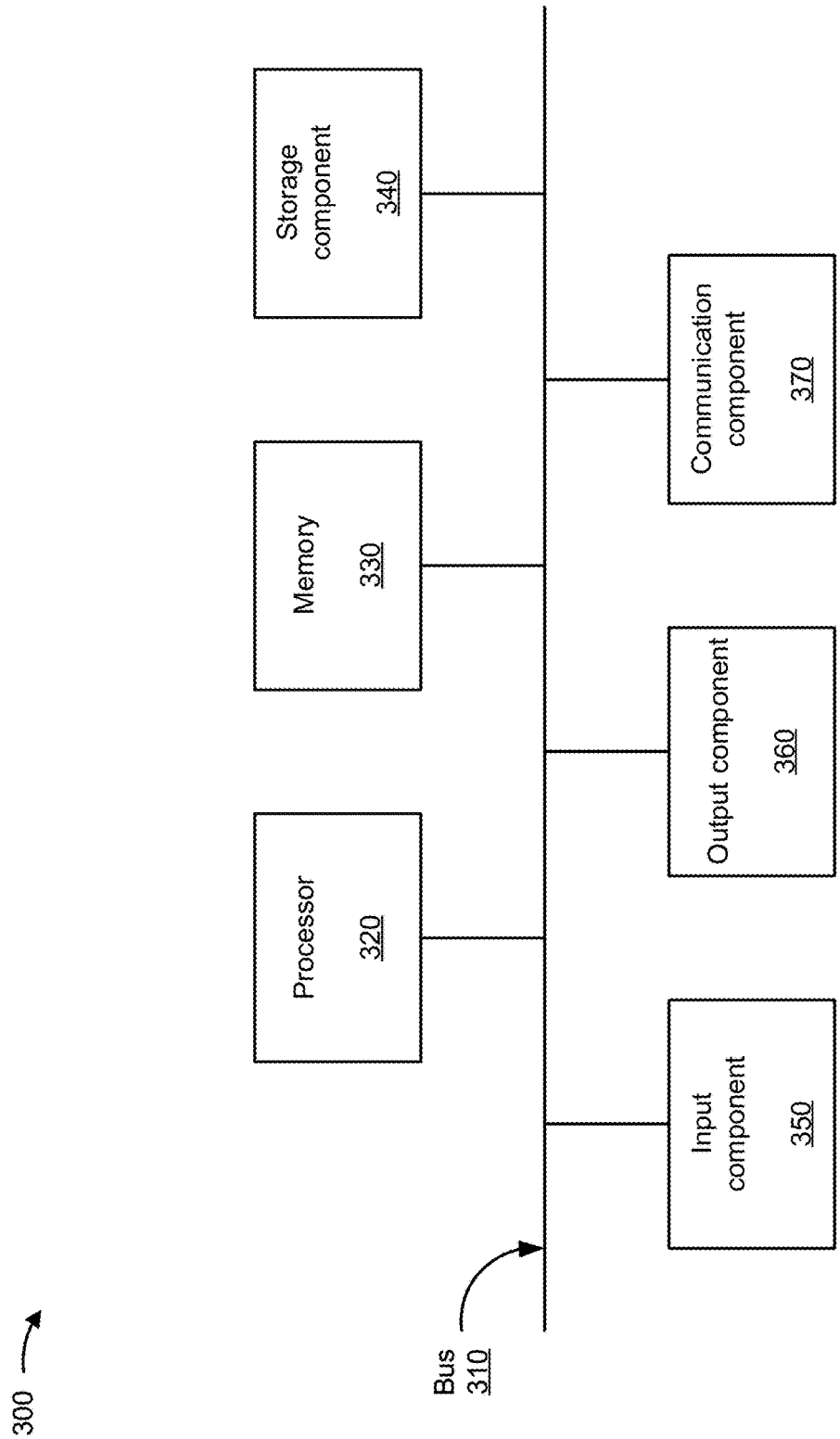
FIG. 3 is a diagram of example components of one or more tools and/or devices of FIG. 1.

FIG. 3 is a diagram of example components of a device 300. Device 300 may correspond to pre-clean tool 102, deposition tool 104, annealing tool 106, photoresist tool 108, etch tool 110, and/or wafer/die transport device 112. In some implementations, pre-clean tool 102, deposition tool 104, annealing tool 106, photoresist tool 108, etch tool 110, and/or wafer/die transport device 112 may include one or more devices 300 and/or one or more components of device 300. As shown in FIG. 3, device 300 may include a bus 310, a processor 320, a memory 330, a storage component 340, an input component 350, an output component 360, and a communication component 370.

Bus 310 includes a component that permits communication among the components of device 300. Processor 320 is implemented in hardware, firmware, or a combination of hardware and software. Processor 320 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 320 includes one or more processors capable of being programmed to perform a function. Memory 330 includes a random access memory (RAM), a read only memory (ROM), and/or another type of dynamic or static storage device (e.g., a flash memory, a magnetic memory, and/or an optical memory) that stores information and/or instructions for use by processor 320.

Storage component 340 stores information and/or software related to the operation and use of device 300. For example, storage component 340 may include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive.

Input component 350 includes a component that permits device 300 to receive information, such as via user input (e.g., a touch screen display, a keyboard, a keypad, a mouse, a button, a switch, and/or a microphone). Additionally, or alternatively, input component 350 may include a sensor for sensing information (e.g., a global positioning system (GPS) component, an accelerometer, a gyroscope, and/or an actuator). Output component 360 includes a component that provides output information from device 300 (e.g., a display, a speaker, and/or one or more LEDs).

Communication component 370 includes a transceiver-like component (e.g., a transceiver and/or a separate receiver and transmitter) that enables device 300 to communicate with other devices, such as via a wired connection, a wireless connection, or a combination of wired and wireless connections. Communication component 370 may permit device 300 to receive information from another device and/or provide information to another device. For example, communication component 370 may include an Ethernet interface, an optical interface, a coaxial interface, an infrared interface, an RF interface, a universal serial bus (USB) interface, a wireless local area interface, a cellular network interface, and/or the like.

Device 300 may perform one or more processes described herein. Device 300 may perform these processes based on processor 320 executing software instructions stored by a non-transitory computer-readable medium, such as memory 330 and/or storage component 340. A computer-readable medium is defined herein as a non-transitory memory device. A memory device includes memory space within a single physical storage device or memory space spread across multiple physical storage devices.

Software instructions may be read into memory 330 and/or storage component 340 from another computer-readable medium or from another device via communication component 370. When executed, software instructions stored in memory 330 and/or storage component 340 may cause processor 320 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 3 are provided as an example. In practice, device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

Figure 4:
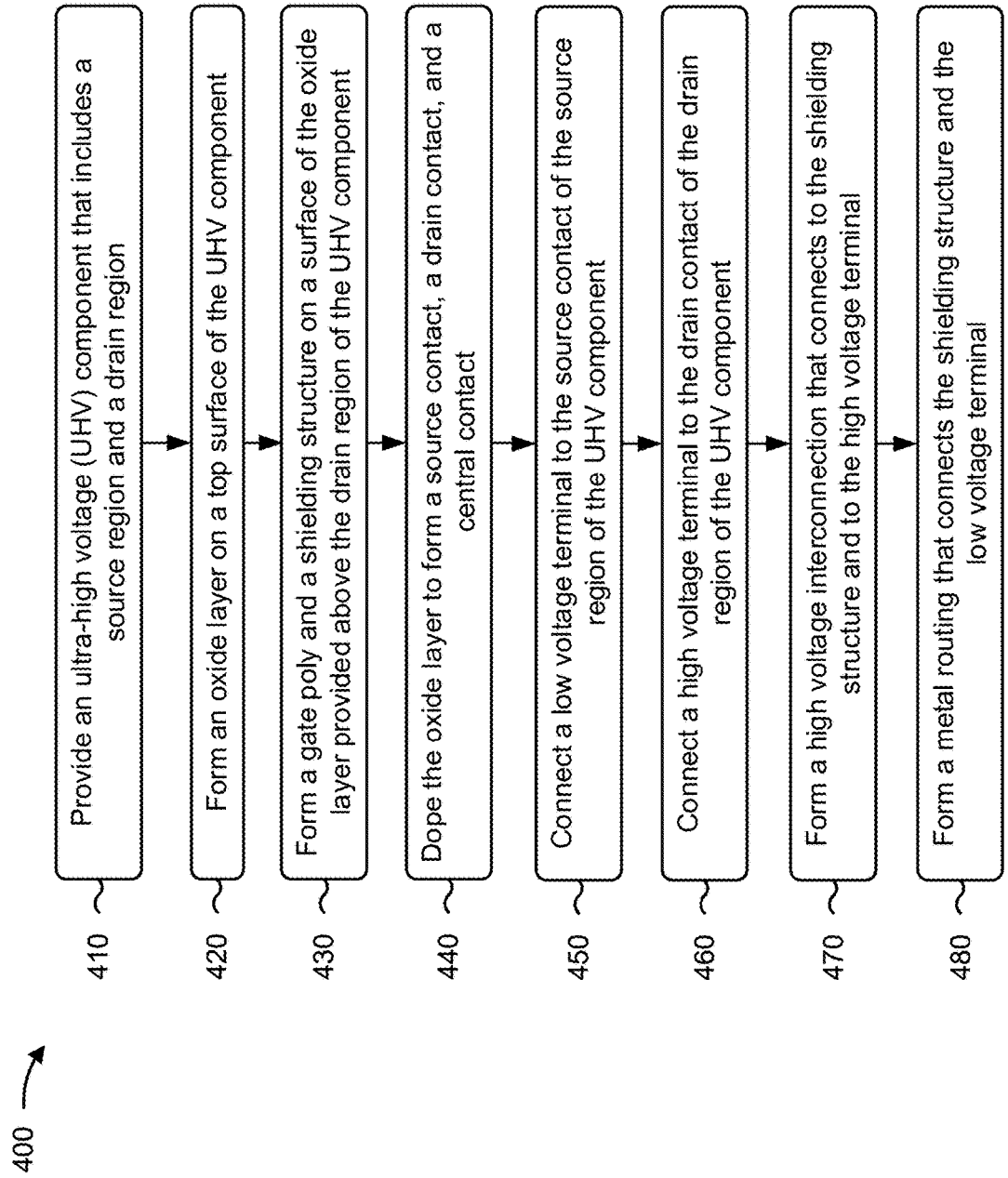
FIG. 4 is a flowchart of an example process for providing a shielding structure for ultra-high voltage (UHV) semiconductor devices.

FIG. 4 is a flow chart of an example process 400 for providing a shielding structure for UHV semiconductor devices. In some implementations, one or more process blocks of FIG. 4 may be performed by a device (e.g., one or more of the tools depicted in FIG. 1). In some implementations, one or more process blocks of FIG. 4 may be performed by another device or a group of devices separate from or including the one or more tools depicted in FIG. 1. Additionally, or alternatively, one or more process blocks of FIG. 4 may be performed by one or more components of device 300, such as processor 320, memory 330, storage component 340, input component 350, output component 360, communication component 370, and/or the like.

As shown in FIG. 4, process 400 may include providing an UHV component that includes a source region and a drain region (block 410). For example, the device may provide an UHV component that includes a source region 204 and a drain region 206, as described above.

As further shown in FIG. 4, process 400 may include forming an oxide layer on a top surface of the UHV component (block 420). For example, the device may form an oxide layer 222 on a top surface of the UHV component, as described above.

As further shown in FIG. 4, process 400 may include forming a gate poly and a shielding structure on a surface of the oxide layer provided above the drain region of the UHV component (block 430). For example, the device may form a gate poly 226 and a shielding structure 230 on a surface of the oxide layer 222 provided above the drain region 204 of the UHV component, as described above.

As further shown in FIG. 4, process 400 may include doping the oxide layer to form a source contact, a drain contact, and a central contact (block 440). For example, the device may dope the oxide layer 222 to form a source contact 234, a drain contact 236, and a central contact 238, as described above.

As further shown in FIG. 4, process 400 may include connecting a low voltage terminal to the source contact in the source region of the UHV component (block 450). For example, the device may connect a low voltage terminal 242 to the source contact 234 in the source region 204 of the UHV component, as described above.

As further shown in FIG. 4, process 400 may include connecting a high voltage terminal to the drain contact in the drain region of the UHV component (block 460). For example, the device may connect a high voltage terminal 244 to the drain contact 236 in the drain region 206 of the UHV component, as described above.

As further shown in FIG. 4, process 400 may include forming a high voltage interconnection that connects to the shielding structure and to the high voltage terminal (block 470). For example, the device may form a high voltage interconnection 250 that connects to the shielding structure 230 and to the high voltage terminal 244, as described above.

As further shown in FIG. 4, process 400 may include forming a metal routing that connects the shielding structure and the low voltage terminal (block 480). For example, the device may form a metal routing 252 that connects the shielding structure 230 and the low voltage terminal 242, as described above.

Process 400 may include additional implementations, such as any single implementation or any combination of implementations described below and/or in connection with one or more other processes described elsewhere herein.

In a first implementation, the source region 204 includes a first type of well 208 and the drain region 206 includes a second type of well 210, wherein the first type of well is different than the second type of well. In a second implementation, alone or in combination with the first implementation, the shielding structure 230 includes a winding-type implant polysilicon material. In a third implementation, alone or in combination with one or more of the first and second implementations, the shielding structure 230 includes one of a single winding polysilicon line 254, 256, two winding polysilicon lines 258, or four winding polysilicon lines, 260.

In a fourth implementation, alone or in combination with one or more of the first through third implementations, the shielding structure 230 is configured to shield a high voltage electric field, generated by the high voltage interconnection 250, to maintain a breakdown voltage stability of the device. In a fifth implementation, alone or in combination with one or more of the first through fourth implementations, the UHV component includes a high voltage junction termination 244, 246.

In a sixth implementation, alone or in combination with one or more of the first through fifth implementations, the shielding structure 230 is configured to reduce an area of the UHV component by approximately 13% relative to a UHV component without the shielding structure. In a seventh implementation, alone or in combination with one or more of the first through sixth implementations, the winding polysilicon line includes a width in a range from approximately 0.05 microns to approximately 7.5 microns. In an eighth implementation, alone or in combination with one or more of the first through seventh implementations, the winding polysilicon line includes a length that is greater than or equal to approximately 0.05 microns.

In a ninth implementation, alone or in combination with one or more of the first through eighth implementations, the winding polysilicon line includes at least one spacing in a range from approximately 0.03 microns to approximately 4.5 microns. In a tenth implementation, alone or in combination with one or more of the first through ninth implementations, the winding polysilicon line includes at least one angle of curvature in a range from approximately one degree to approximately thirty degrees. In an eleventh implementation, alone or in combination with one or more of the first through tenth implementations, the shielding structure 230 includes a plurality of winding polysilicon lines.

In a twelfth implementation, alone or in combination with one or more of the first through eleventh implementations, the winding polysilicon line includes zero or more U-turns. In a thirteenth implementation, alone or in combination with one or more of the first through twelfth implementations, the device may include one of an ultra-high voltage semiconductor device or a laterally-diffused metal-oxide semiconductor device. In a fourteenth implementation, alone or in combination with one or more of the first through thirteenth implementations, the one or more winding polysilicon lines include a plurality of winding polysilicon lines that each connects to the high voltage terminal 244 at a respective first end and to the low voltage terminal 242 at a respective second end. In a fifteenth implementation, alone or in combination with one or more of the first through fourteenth implementations, the UHV component includes a high voltage junction termination 244, 246.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

Figure 5:
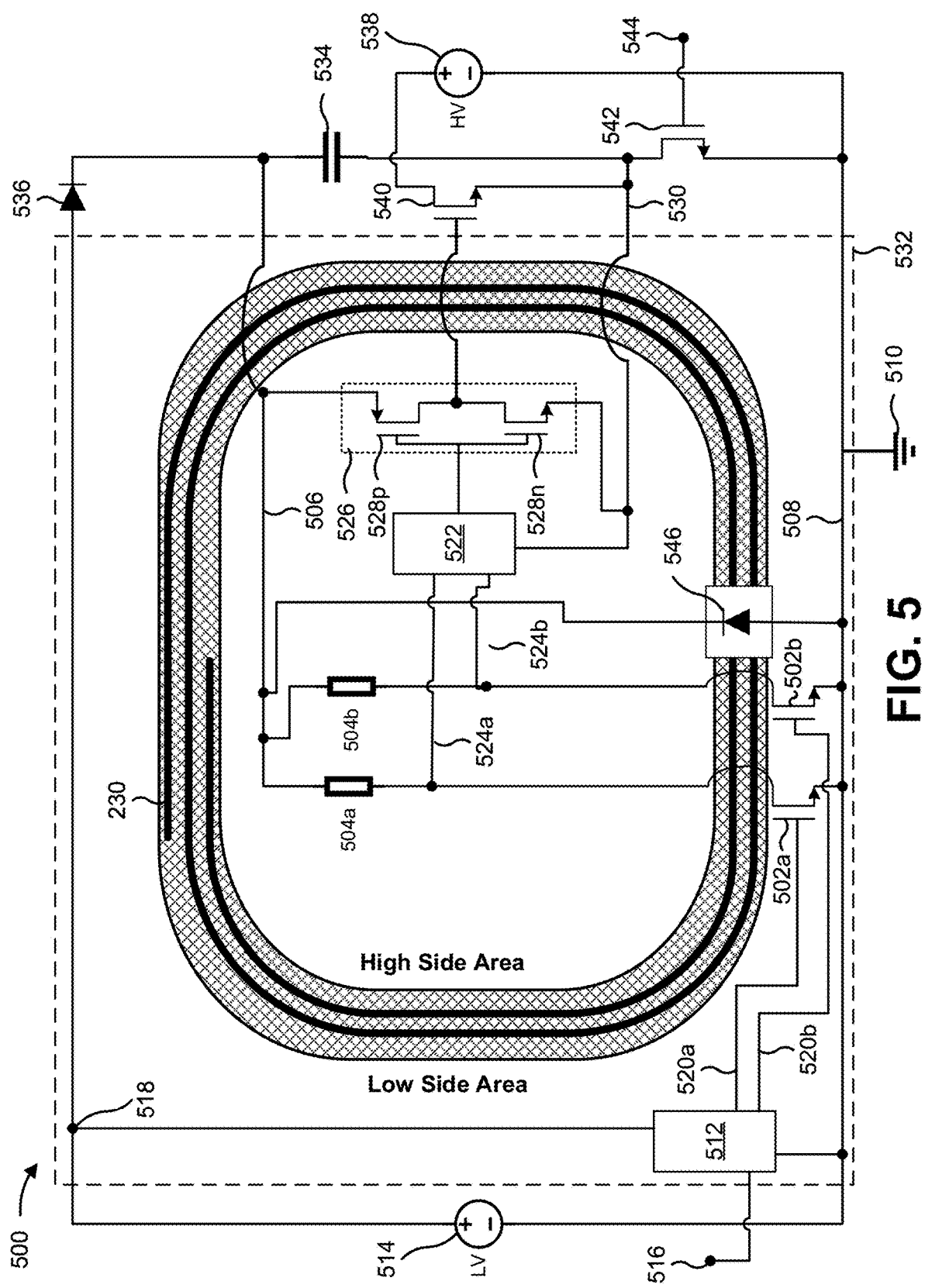
FIG. 5 is a diagram of an example circuit described herein including the example semiconductor device of FIGS. 2A-2J.

FIG. 5 is a diagram of an example circuit 500 described herein including the example semiconductor device of FIGS. 2A-2J (e.g., an HVJT device including the shielding structure 230). The circuit 500 may, for example, be or comprise a high-side gate driver circuit. As illustrated in FIG. 5, a level shifter may include a first high voltage metal-oxide semiconductor (HVMOS) device 502a and the second HVMOS device 502b. The level shifter may further include a first resistor 504a and a second resistor 504b. In some implementations, the first and second HVMOS devices 502a, 502b are n-channel laterally-diffused metal-oxide semiconductor (LDMOS) transistors. The first HVMOS device 502a and the first resistor 504a are electrically coupled in series from a high side supply node 506 (e.g., HS_Vdd) to a low voltage return node 508 (e.g., LV_Vss), such that the first HVMOS device 502a is separated from the high side supply node 506 by the first resistor 504A. Similarly, the second HVMOS device 502b and the second resistor 504b are electrically coupled in series from the high side supply node 506 to the low voltage return node 508, such that the second HVMOS device 502b is separated from the high side supply node 506 by the second resistor 504b. In some implementations, the low voltage return node 508 is electrically coupled to ground 510.

An edge pulse generator 512 is powered by a low voltage power supply 514, and controls gates of the first and second HVMOS devices 502a, 502b based on a high side input signal 516. The high side input signal 516 is a binary signal varying between 0 volts and a voltage of the low voltage power supply 514. The low voltage power supply 514 has an anode electrically coupled to a low voltage supply node 518 (e.g., LV_Vdd), and a cathode electrically coupled to the low voltage return node 508. The low voltage power supply 514 may be, for example, a direct current (DC) power supply, and/or may, for example, supply a low voltage between about 1-20 volts, between about 1-10 volts, between about 10-20 volts, or less than about 20 volts. The edge pulse generator 512 detects rising edges of the high side input signal 516, and further detects falling edges of the high side input signal 516. Further, the edge pulse generator 512 generates a rising-edge signal 520a and a falling-edge signal 520b. The rising-edge signal 520a has a pulse at each of the detected rising edges and gates the first HVMOS device 502a. The falling-edge signal 520b has a pulse at each of the detected falling edges and gates the second HVMOS device 502b.

A set-reset (S-R) latch 522 is set by a set signal 524a at a shared node of the first HVMOS device 502a and the first resistor 504a, and is further reset by a reset signal 524b at a shared node of the second HVMOS device 502b and the second resistor 504b. In some implementations, the set and reset signals 524a, 524b pass through a noise filter (not shown) before passing to the S-R latch 522. An inverted output (e.g., Q) of the S-R latch 522 controls a gate driver 526 to selectively switch the gate driver 526 between an ON state and an OFF state. For example, the gate driver 526 may be in an ON state when the inverted output of the S-R latch 522 indicates a binary "0" and may be in an OFF state when the inverted output of the S-R latch 522 indicates a binary "1". In some implementations, the gate driver 526 is or includes a complementary metal-oxide semiconductor (CMOS) inverter. In some implementations, the gate driver 526 includes a p-channel metal-oxide semiconductor field-effect transistor (MOSFET) 528p and an n-channel MOSFET 528n connected in series from the high side supply node 506 to a high side return (e.g., HS_Vss) node 530, such that the p-channel MOSFET 528p separates the n-channel MOSFET 528n from the high side supply node 506.

In some implementations, the composite structure is square ring shaped, rectangular ring shaped, triangular ring shaped, circular ring shaped, or some other closed path shape. Further, the composite structure is surrounded by a low voltage area of the IC die 532. The high side area accommodates the S-R latch 522, the gate driver 526, the first resistor 504a, and the second resistor 504b, whereas the low voltage area accommodates the edge pulse generator 512. The HVJT device including the shielding structure is or includes a diode 546 and electrically separates the low voltage area from the high side area. In some implementations, a cathode of the diode 546 is electrically coupled to the high side supply node 506, and/or an anode of the diode 546 is electrically coupled to the low voltage return node 508.

A bootstrap capacitor 534 is electrically coupled from the high side supply node 506 to the high side return node 530. The bootstrap capacitor 534 is charged by the low voltage power supply 514, through a bootstrap diode 536, while the gate driver 526 is in the OFF state. Further, the bootstrap capacitor 534 powers devices (e.g., the S-R latch 522) at the high side area to change the gate driver 526 to the ON state. A high side power supply 538 is electrically coupled to the low voltage return node 508, and is selectively electrically coupled to the high side return node 530 by a first power MOSFET 540. In some implementations, an insulated-gate bipolar transistor (IGBT) or some other switching device is alternatively be used in place of the first power MOSFET 540. The high side power supply 538 may be, for example, a DC power supply, and/or may, for example, supply a high voltage between about 300-1200 volts, between about 300-750 volts, between about 750-1200 volts, between about 550-650 volts, or in excess of 300 volts. The first power MOSFET 540 is gated by an output of the gate driver 526 and may be, for example, an n-channel power MOSFET. In some embodiments, the output of the gate driver 526 is at a node shared by the p-channel MOSFET 528p and the n-channel MOSFET 528n.

The bootstrap diode 536 limits the flow of current between the low voltage supply node 514 and the high side supply node 506. The bootstrap diode 536 allows current to flow from the low voltage supply node 518 to the high side supply node 506 while the high side supply node 506 is at a lower voltage level than the low voltage supply node 518. This may occur while the gate driver 526 is in the OFF state and allows the bootstrap capacitor 534 to be charged. Further, the bootstrap diode 536 blocks current from flowing between the low voltage supply node 518 and the high side supply node 506 while the high side supply node 506 is at a higher voltage level than the low voltage supply node 518. This may occur while the gate driver 526 is in the ON state and prevents devices at the low voltage area from being damaged by high voltages of the high side power supply 538.

In operation, to disable the first power MOSFET 540, the high side input signal 516 is changed from a binary "1" to a binary "0", thereby resetting the S-R latch 522. After resetting the S-R latch 522, the S-R latch 522 outputs a binary "1" at the inverted output, which disables the p-channel MOSFET 528p and enables the n-channel MOSFET 528n. This electrically shorts the gate of the first power MOSFET 540 and the source of the first power MOSFET 540, thereby disabling the first power MOSFET 540. Additionally, the high side return node 530 is electrically coupled to the low voltage return node 508. In some embodiments, this electrical coupling is performed by a second power MOSFET 542 or some other switching device. The second power MOSFET 542 is gated by a low-side input signal 544, which may, for example, be generated by a low-side gate driver circuit. Since the bootstrap capacitor 534 has largely been discharged and the high side return node 530 is electrically coupled to the low voltage return node 508, the voltage at the high side supply node 506 is low compared to the voltage of the low voltage supply node 518. Therefore, the bootstrap diode 536 is operating in a forward biased state and allows the flow of current between the low voltage supply node 518 and the high side supply node 506. This, in turn, charges the bootstrap capacitor 534 from the low voltage power supply 514.

To enable the first power MOSFET 540, the high side return node 530 is electrically separated from the low voltage return node 508, such that the high side return node 530 is floating. In some implementations, this electrical separation is performed by the second power MOSFET 542. The high side return node 530 floats upward, whereby the bootstrap diode 536 moves to a reverse biased state. Further, the high side input signal 516 is changed from a binary "0" to a binary "1". This change sets the S-R latch 522, such that the inverted output of the S-R latch 522 is at a binary "0". The inverted output enables the p-channel MOSFET 528p and enables the n-channel MOSFET 528n, which electrically couples the bootstrap capacitor 534 from the gate of the first power MOSFET 540 to the source of the first power MOSFET 540. Charge accumulated in the bootstrap capacitor 534 enables the first power MOSFET 540, which electrically couples the high side power supply 538 to the high side return node 530. This changes a voltage at the high side supply node 506 to the voltage of the high side power supply 538 plus the voltage across the bootstrap capacitor 534.

As indicated above, FIG. 5 is provided merely an example. Other examples may differ from what is described with regard to FIG. 5.

In this way, shielding structure 230 may be provided for UHV semiconductor devices that include HVJT components. Shielding structure 230 may be formed by connecting an implant polysilicon (poly) line to an HVJT component (e.g., high voltage terminal 242) that makes a BV of the HVJT component more robust and significantly reduces the area of the HVJT component (e.g., by approximately 13%) compared to the area of the traditional HVJT component. Shielding structure 230 effectively and successfully shields the HVJT component from a high-voltage electric field generated by HVI 250. Shielding structure 230 may be applied to UHV semiconductor devices, LDMOS devices, and/or the like.

As described in greater detail above, some implementations described herein provide a method for manufacturing a device. The method may include providing an ultra-high voltage (UHV) component that includes a source region and a drain region, and forming an oxide layer on a top surface of the UHV component. The method may include connecting a low voltage terminal to the source region of the UHV component, and connecting a high voltage terminal to the drain region of the UHV component. The method may include forming a shielding structure on a surface of the oxide layer provided above the drain region of the UHV component, and forming a high voltage interconnection that connects to the shielding structure and to the high voltage terminal. The method may include forming a metal routing that connects the shielding structure and the low voltage terminal.

As described in greater detail above, some implementations described herein provide a device. The device may include a substrate that includes a source region and a drain region, and an oxide layer formed on a top surface of the substrate. The device may include a low voltage terminal coupled to the source region of the substrate, and a high voltage terminal coupled to the drain region of the substrate. The device may include a shielding structure formed on a surface of the oxide layer provided above the drain region of the substrate, wherein the shielding structure includes a winding polysilicon line. The device may include a high voltage interconnection coupled to the shielding structure and to the high voltage terminal, and a metal routing that couples the shielding structure and the low voltage terminal.

As described in greater detail above, some implementations described herein provide a method for manufacturing a device. The method may include providing a substrate that includes a source region and a drain region, and forming an oxide layer on a top surface of the substrate. The method may include connecting a low voltage terminal to the source region of the substrate, and connecting a high voltage terminal to the drain region of the substrate, wherein the high voltage terminal is configured to receive an amount of voltage that is greater than an amount of voltage that the low voltage terminal is configured to receive. The method may include forming a shielding structure on a surface of the oxide layer provided above the drain region of the substrate, wherein the shielding structure includes one or more winding polysilicon lines. The method may include forming a high voltage interconnection that connects to the shielding structure and to the high voltage terminal, and forming a metal routing that connects the shielding structure and the low voltage terminal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that those skilled in the art may make various changes, substitutions, and alterations herein without departing from the spirit and scope of the present disclosure.

What is claimed is:

1. A method for manufacturing a device, the method comprising:
   providing an ultra-high voltage (UHV) component that includes a source region and a drain region;
   forming an oxide layer on a top surface of the UHV component;
   connecting a low voltage terminal to the source region of the UHV component;
   connecting a high voltage terminal to the drain region of the UHV component;
   forming a shielding structure to be in contact with a surface of the oxide layer provided above the drain region of the UHV component,
      wherein the shielding structure comprises an implant polysilicon material;
   forming a high voltage interconnection that connects to the shielding structure and to the high voltage terminal; and
   forming a metal routing that connects the shielding structure and the low voltage terminal.

2. The method of claim 1, wherein the source region includes a first type of well and the drain region includes a second type of well,
   wherein the first type of well is different than the second type of well.

3. The method of claim 1, wherein the implant polysilicon material for the shielding structure is a winding-type implant polysilicon material.

4. The method of claim 1, wherein the shielding structure includes one of:
a single winding polysilicon line,
two winding polysilicon lines, or
four winding polysilicon lines.

5. The method of claim 1, wherein the shielding structure is configured to shield a high voltage electric field, generated by the high voltage interconnection, to maintain a breakdown voltage stability of the device.

6. The method of claim 1, wherein the UHV component includes a high voltage junction termination.

7. The method of claim 1, wherein the shielding structure is configured to reduce an area of the UHV component by approximately 13% relative to a UHV component without the shielding structure.

8. A device, comprising:
a substrate that includes a source region and a drain region;
an oxide layer formed on a top surface of the substrate;
a low voltage terminal coupled to the source region of the substrate;
a high voltage terminal coupled to the drain region of the substrate;
a shielding structure formed directly on a surface of the oxide layer provided above the drain region of the substrate,
wherein the shielding structure includes a winding-type implant polysilicon line;
a high voltage interconnection coupled to the shielding structure and to the high voltage terminal; and
a metal routing that couples the shielding structure and the low voltage terminal.

9. The device of claim 8, wherein the winding-type implant polysilicon line includes a width in a range from approximately 0.05 microns to approximately 7.5 microns.

10. The device of claim 8, wherein the winding-type implant polysilicon line includes a length that is greater than or equal to approximately 0.05 microns.

11. The device of claim 8, wherein the winding-type implant polysilicon line includes at least one spacing in a range from approximately 0.03 microns to approximately 4.5 microns.

12. The device of claim 8, wherein the winding-type implant polysilicon line includes at least one angle of curvature in a range from approximately one degree to approximately thirty degrees.

13. The device of claim 8, wherein the shielding structure includes a plurality of winding polysilicon lines.

14. The device of claim 8, wherein the winding-type implant polysilicon line includes zero or more U-turns.

15. A method for manufacturing a device, the method comprising:
providing a substrate that includes a source region and a drain region;
forming an oxide layer on a top surface of the substrate;
connecting a low voltage terminal to the source region of the substrate;
connecting a high voltage terminal to the drain region of the substrate,
wherein the high voltage terminal is configured to receive an amount of voltage that is greater than an amount of voltage that the low voltage terminal is configured to receive;
forming a shielding structure directly on a surface of the oxide layer provided above the drain region of the substrate,
wherein the shielding structure includes one or more winding-type implant polysilicon lines;
forming a high voltage interconnection that connects to the shielding structure and to the high voltage terminal; and
forming a metal routing that connects the shielding structure and the low voltage terminal.

16. The method of claim 15, wherein the device includes one of an ultra-high voltage semiconductor device or a laterally-diffused metal-oxide semiconductor device.

17. The method of claim 15, wherein the one or more winding-type implant polysilicon lines include a plurality of winding polysilicon lines that each connects to the high voltage terminal at a respective first end and to the low voltage terminal at a respective second end.

18. The method of claim 15, wherein the substrate includes a high voltage junction termination.

19. The method of claim 15, wherein each of the one or more winding-type implant polysilicon lines include a width in a range from approximately 0.05 microns to approximately 7.5 microns.

20. The method of claim 15, wherein each of the one or more winding-type implant polysilicon lines includes:
a length that is greater than or equal to approximately 0.05 microns,
at least one spacing in a range from approximately 0.03 microns to approximately 4.5 microns, and
at least one angle of curvature in a range from approximately one degree to approximately thirty degrees.

* * * * *